United States Patent
Tanaka et al.

(10) Patent No.: US 6,677,056 B2
(45) Date of Patent: Jan. 13, 2004

(54) METHOD FOR PRODUCING TIN-SILVER ALLOY PLATING FILM, THE TIN-SILVER ALLOY PLATING FILM AND LEAD FRAME FOR ELECTRONIC PARTS HAVING THE PLATING FILM

(75) Inventors: Hisahiro Tanaka, Fukuoka (JP); Matsuo Masuda, Oita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/274,033

(22) Filed: Oct. 21, 2002

(65) Prior Publication Data

US 2003/0082398 A1 May 1, 2003

(30) Foreign Application Priority Data

Oct. 24, 2001 (JP) .......................... 2001-326292

(51) Int. Cl.$^7$ ........................ B32B 15/01; C25D 3/60; C25D 5/18; H01L 23/495
(52) U.S. Cl. ..................... 428/646; 428/647; 428/935; 205/104; 205/252
(58) Field of Search ................. 428/646, 647, 428/673, 935, 648; 205/105, 106, 107, 108, 102, 252, 253, 254, 103, 104

(56) References Cited

U.S. PATENT DOCUMENTS

| | | | | |
|---|---|---|---|---|
| 5,902,472 A | * | 5/1999 | Arai et al. ................. | 205/125 |
| 6,087,714 A | * | 7/2000 | Kubara et al. ............. | 257/666 |
| 6,210,556 B1 | * | 4/2001 | Toben et al. ............... | 205/253 |
| 6,395,583 B1 | * | 5/2002 | Kubara et al. ............. | 438/123 |
| 6,575,354 B2 | * | 6/2003 | Tanaka et al. ............. | 228/254 |

FOREIGN PATENT DOCUMENTS

| | | | |
|---|---|---|---|
| JP | 11-307710 | * | 11/1999 |
| JP | 2000-164782 | * | 6/2000 |
| JP | 2000307046 | | 11/2000 |
| JP | 2000319793 | | 11/2000 |

OTHER PUBLICATIONS

Leidheiser et al., "Pulse Electroplating of Silver–Tin Alloys and the Formation of Ag3Sn", J. Electrochem. Soc. : Electrochemica Science and Technology, Apr. 1973, pp. 484–487.*

* cited by examiner

Primary Examiner—John J. Zimmerman
(74) Attorney, Agent, or Firm—Stevens, Davis, Miller & Mosher, LLP.

(57) ABSTRACT

A tin-silver alloy plating film improved in solderability and flex cracking characteristics is provided by producing it by an electroplating process which uses a current having a pulse waveform of a current passing period of not less than 3 ms and not more than 500 ms and a stopping period of not less than 1 ms and not more than 500 ms with a proviso that the stopping period is equal to or shorter than the passing period.

6 Claims, 3 Drawing Sheets

US 6,677,056 B2

METHOD FOR PRODUCING TIN-SILVER ALLOY PLATING FILM, THE TIN-SILVER ALLOY PLATING FILM AND LEAD FRAME FOR ELECTRONIC PARTS HAVING THE PLATING FILM

BACKGROUND OF THE INVENTION

1. Field of the Invention

The present invention relates to a soldering technique employed for making electric and electronic parts or circuits using no lead. Particularly, it relates to a method for producing a tin-silver alloy plating film required to have solderability which is used as materials of electric and electronic parts, and to electric and electronic parts having the tin-silver alloy plating film formed by the above method.

2. Description of the Prior Art

Tin plating and tin alloy plating such as tin-lead alloy or tin-zinc alloy plating are widely used as industrial plating for parts in electronic industries, the representatives of which are weak current parts and lead frames, because of their good corrosion resistance and solderability. There have been developed various plating baths used for the above-mentioned tin plating and alloy plating such as tin-lead plating or tin-zinc plating.

Recently, environmental problems have been regarded as important, and, as to the parts used for IC packages, it has been attempted to use materials containing no injurious materials for environments. Of materials used for lead frames for electronic parts, one of the materials especially harmful for environments is lead used in solders. When allowed to stand, lead dissolves out of the solder and exerts a harmful influence upon the human body and living organisms. For this reason, development of solders or solder pastes using no lead has been tried in the electronic industries. However, materials having characteristics superior to the lead-containing solders have not yet been put to practical use. Various researches have been made on lead frames for electronic parts.

One example of conventional lead frames will be shown below. FIG. 3 is a plan view of a general lead frame, and FIG. 4 is a sectional view of a general lead frame. In FIG. 3 and FIG. 4, 1 indicates a portion on which a chip is mounted, 2 indicates an inner lead portion, 3 indicates an outer lead portion, 4 indicates a tie bar portion, 5 indicates a semiconductor chip, 6 indicates an adhesive, 7 indicates an electrode pad, 8 indicates a bonding wire, and 9 indicates a molding resin. Previously, the inner lead portion 2 is subjected to partial plating with Ag and the outer lead portion 3 is subjected to tin alloy plating. The semiconductor chip 5 is bonded to the portion 1 on which a chip is mounted, a terminal of the semiconductor chip 5 and the inner lead portion 2 are bonded with the bonding wire 8, and furthermore the whole other than the outer lead portion 3 is sealed with the molding resin 9.

The plan view of the lead frame shown in FIG. 3 shows only the lead frame before carrying out the bonding of semiconductor chip 5, the bonding with bonding wire 8, and the sealing with molding resin 9. Actually, after carrying out the bonding of semiconductor chip 5, the bonding with bonding wire 8, and the sealing with molding resin 9, the corresponding inner lead portion 2 and outer lead portion 3 are electrically connected, and the lead frame is cut so that the adjacent inner lead portions 2 per se and the adjacent outer lead portions 3 per se do not short-circuit each other. Thereafter, the outer lead portion 3 is bonded to other electronic part by soldering.

As substitutes for lead-containing solders, lead frames, the whole surface of which is plated with palladium, have been put to practical use. However, use of palladium as a single substance causes deterioration in wettability with the solder when heat is applied at the die attaching step or wire bonding step, and thus there is a problem of deterioration in reliability of soldering conducted for mounting. Therefore, there is proposed a lead frame for electronic parts which is thinly plated with gold as a protective film on the surface of palladium. However, countries supplying palladium are limited, and short supply thereof causes increase of price, resulting in problems in cost and stable supply. Furthermore, in the case of the lead frames, the whole surface of which is plated with palladium, a difference in potential is produced between palladium and a metal which is a substrate of the lead frame, and, therefore, nickel or a palladium-nickel alloy must be allowed to be present between the palladium and the substrate. In this case, if nickel or a nickel alloy or iron or an iron alloy is used as the substrate, there are problems in reliability owing to corrosion even if nickel or a palladium-nickel alloy is allowed to be present. Therefore, the palladium plating can only be applied to a substrate of copper or a copper alloy at present.

As for plating other than palladium plating, there is attempted to form a solder plating containing no lead using a metal such as indium, bismuth or zinc in place of lead used in the tin-lead based solders used at present. As solder alloys or solder pastes for reflow soldering, there are proposed ternary or quaternary alloys containing two or more metals in addition to tin. However, it is difficult to control the composition of the ternary or quaternary alloy in plating solution, and binary alloys comprising tin and another metal are mostly used, but alloys comprising tin and indium are difficult to put to practical use because indium is high in cost. In the case of alloys comprising tin and bismuth, the melting points can be reduced, but they are hard and brittle and, hence, inferior in workability and can hardly be used for lead frames which are subjected to flexural working. Moreover, they suffer from the problems that they are low in bonding strength, are inferior in thermal fatigue strength, and there is apt to occur the lift-off phenomenon in which the bonded part and the substrate is separated at the interface during surface mounting. Those which comprise tin and zinc have a melting point close to that of the conventional tin-lead based solders, and cost of zinc is low, but since zinc is readily oxidized in the air, when heat is applied in the step of fabrication of semiconductor devices such as IC, they are oxidized, resulting in deterioration of solder wettability.

Therefore, recently, alloys comprising tin and silver are proposed as the most hopeful alloys containing no lead, and intensive researches have been made to develop plating solutions. It has been attempted to improve characteristics such as appearance, flex cracking, and solder wettability and to inhibit discoloration due to thermal history, but these characteristics have not yet reached satisfactory levels at present.

For improving the solder wettability, it is effective to improve gloss of the plating film, but when the gloss is improved, the film increases in hardness and rather deteriorates in flex cracking characteristics. That is, it is extremely difficult to satisfy both the solderability and the flex cracking characteristics.

As mentioned above, the conventional technology can not necessarily be said to have sufficiently attained the practical task of solders using no lead. Particularly, in the case of lead frames of pre-plated frame (PPF) type in which the partial Ag plating of the inner lead portion on which a semiconductor chip is mounted and the tin alloy plating of the outer lead portion which is bonded to exterior electronic parts are previously conducted, solderability of the tin alloy plating is deteriorated due to the thermal history applied when the semiconductor chip is mounted, causing deterioration of solder wettability at the subsequent steps. This results in adverse effect on soldering performance of the outer lead portion externally exposed after sealing with molding resin.

Furthermore, when the outer lead portion externally exposed is subjected to flexural working at the time of surface mounting, if cracks are present in the portion which is bonded to the substrate, that portion becomes difficult to solder. As a result, formation of back fillet is insufficient, and there is an increased possibility of deterioration in bonding strength between the electronic part and the substrate.

Therefore, tin alloy plating materials used for the pre-plated lead frames must have higher performance and stable properties. Thus, improvement of tin alloy plating solutions has been made, but it is difficult to satisfy all of the required characteristics only by the improvement of plating solutions.

BRIEF SUMMARY OF THE INVENTION

The tin-silver alloy plating films disclosed in JP-A-2000-307046 filed by the inventors have satisfactory physical properties as lead frames used for semiconductor apparatuses, namely, an initial zero-cross time of 0.35–0.8 second and a zero-cross time after heating (175° C., 24 hours) of 0.45–0.9 second. The inventors have conducted further intensive research for providing tin-silver plating films excellent additionally in flex cracking characteristics. As a result, the present invention has been accomplished.

An object of the present invention is to provide a method for producing a tin-silver alloy plating film which can inhibit both the deterioration of solder wettability caused by thermal history and the deterioration of flex cracking characteristics. Another object is to provide a tin-silver alloy plating film which satisfies both the solder wettability and the flex cracking resistance. Further object is to provide an electronic part containing no lead which is one of environmentally harmful materials by using a lead frame for electronic part having the above plating film.

BRIEF SUMMARY OF THE INVENTION

In order to attain the above objects of the present invention, according to the method for producing a tin-silver alloy plating film of the present invention, a tin-silver alloy plating film is formed by an electroplating method using a current having a pulse waveform of a current passing period of not less than 3 ms and not more than 500 ms and a current stopping period of not less than 1 ms and not more than 500 ms with a proviso that the stopping period is equal to or shorter than the passing period. It is preferred to use a current having a pulse waveform of a current passing period of not less than 3 ms and not more than 50 ms and a current stopping period of not less than 1 ms and not more than 50 ms with a proviso that the stopping period is equal to or shorter than the passing period. Preferably, the stopping period is shorter than the passing period. Direct current methods are mainly used for ordinary electroplating. According to the present invention, a current having the pulse waveform is used. The present invention uses a direct current obtained by rectification of an alternating current by a rectifier in a pulse waveform on the order of millisecond.

Furthermore, the tin-silver alloy plating film has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4.

By employing the above construction, there can be provided a method for producing a tin-silver alloy plating film which is less in discoloration upon heating and satisfactory in solder wettability and flex cracking characteristics, the film and a lead frame for electronic parts having the film.

DETAILED DESCRIPTION OF THE INVENTION

Figure 1:
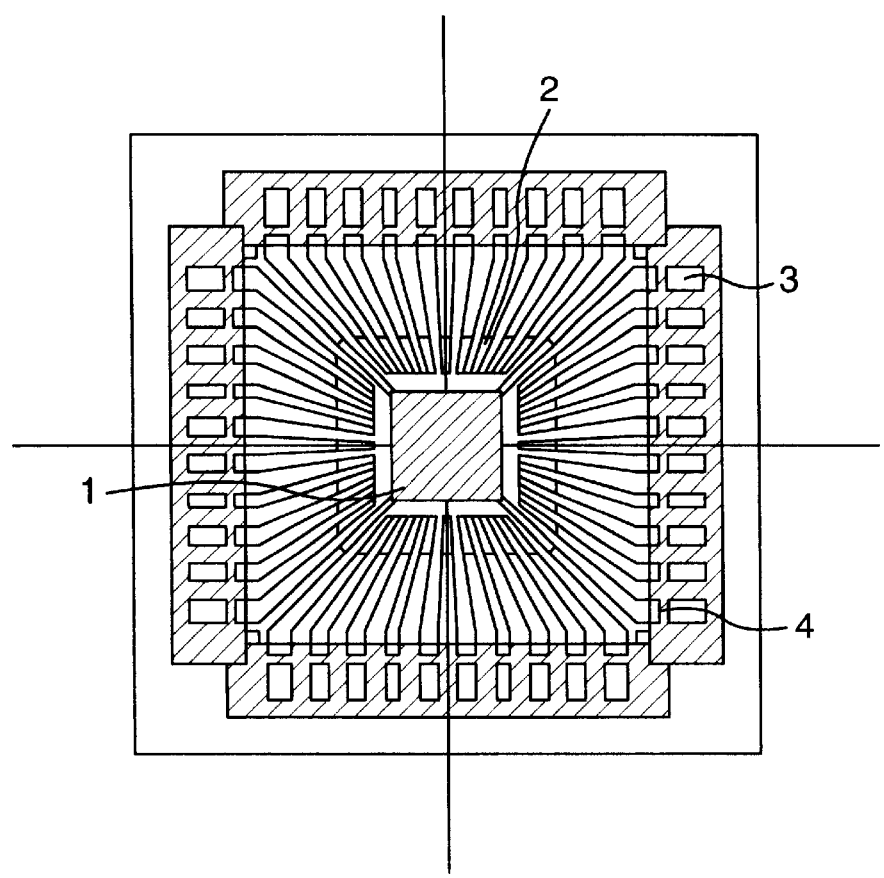
FIG. 1 is a plan view of the lead frame for electronic parts of the present invention.

The first embodiment of the present invention is a method for producing a tin-silver alloy plating film by an electroplating process which uses a current having a pulse waveform of a current passing period of not less than 3 ms and not more than 500 ms and a current stopping period of not less than 1 ms and not more than 500 ms, with a proviso that the stopping period is equal to or shorter than the passing period, preferably the stopping period is shorter than the passing period. In the tin-silver alloy plating film formed by using such current, cracks hardly occur during flexural working because substantially no stress remains in the plating film. Moreover, since gloss is improved, solder wettability is improved and discoloration upon heating is inhibited.

The second embodiment of the present invention is a method for producing a tin-silver alloy plating film by an electroplating process which uses a current having a pulse waveform of a current passing period of not less than 3 ms and not more than 50 ms and a current stopping period of not less than 1 ms and not more than 50 ms, with a proviso that the stopping period is equal to or shorter than the passing period, preferably the stopping period is shorter than the passing period. In the tin-silver alloy plating film formed by using such current, cracks hardly occur during flexural working because substantially no stress remains in the plating film, and, besides, plating scorch hardly occurs because critical current density increases. Moreover, since gloss is improved, solder wettability is improved and discoloration upon heating is inhibited.

The third embodiment of the present invention is the tin-silver alloy plating film produced by the method of the first or second embodiment. In this tin-silver alloy plating film, cracks hardly occur during flexural working because substantially no stress remains in the plating film. Moreover, since gloss is improved, solder wettability is improved and discoloration upon heating is inhibited.

The fourth embodiment of the present invention is a tin-silver alloy plating film which has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4. In this tin-silver alloy plating film, cracks hardly occur during flexural working because substantially no stress remains in the plating film. Moreover, since gloss is improved, solder wettability is improved and discoloration upon heating is inhibited.

This tin-silver alloy plating film can be produced by the method mentioned in the first or second embodiment.

The fifth embodiment of the present invention is a lead frame for electronic parts which has the tin-silver alloy plating film produced using the first or second embodiment. In this lead frame for electronic parts, cracks hardly occur during flexural working because substantially no stress of the plating film remains, and, besides, gloss is improved and, hence, solder wettability is improved and discoloration upon heating is inhibited.

The sixth embodiment of the present invention is a lead frame for electronic parts which has a tin-silver alloy plating film having a reflection density of not less than 1.0 and comprising an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4. In this lead frame having the above tin-silver alloy plating film, cracks hardly occur during flexural working because substantially no stress of the plating film remains, and, besides, gloss is improved and, hence, solder wettability is improved and discoloration upon heating is inhibited. This lead frame can be produced using the tin-silver alloy plating film produced by the method mentioned in the first or second embodiment.

Modes for carrying out the present invention will be explained below.

In the present invention, alloys of tin and silver are used as plating which is not harmful for environment. The tin-silver alloys have no difficulty in resources compared with palladium and no problem in characteristics as compared with tin-bismuth alloys, tin-zinc alloys and tin-indium alloys. The tin-silver alloys have a melting point of 221° C. (eutectic point) which is higher than the melting point of general tin-lead alloys. However, the plating of the outer lead portion of lead frames is not needed to be completely molten and wetted, and suffices if it reacts with the solder paste or reflowing solder at interface at the time of surface mounting to give a sufficient bonding strength. Therefore, for practical use, the solder wettability or bonding strength is the same as that of conventional tin-lead solders.

If the tin-silver alloy plating is carried out using a plating bath in which the plating solution contains no additives, occasionally there are formed spongy or resinous precipitates in the resulting plating film and covering power is sometimes conspicuously deteriorated. Therefore, it is preferred that additives, which are known in this technical filed, are added to the plating solution to control formation of the spongy or resinous precipitates, inhibit whitening, improve covering power of the plating, and broaden the range of current density used.

Figure 2:
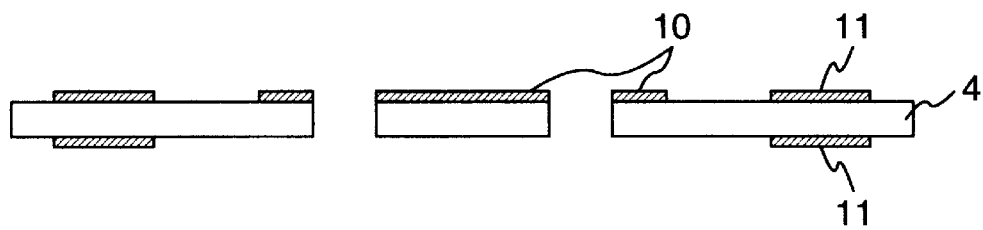
FIG. 2 is a sectional view of the lead frame for electronic parts of the present invention.
Figure 3:
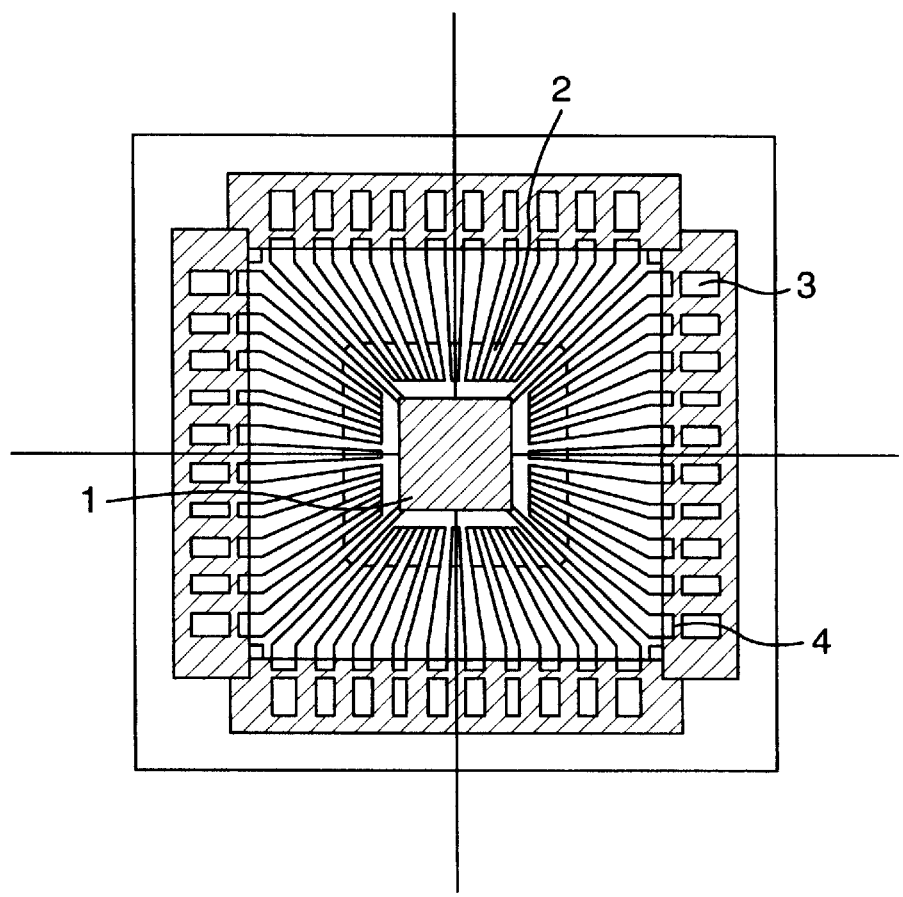
FIG. 3 is a plan view of a conventional lead frame for electronic parts.
Figure 4:
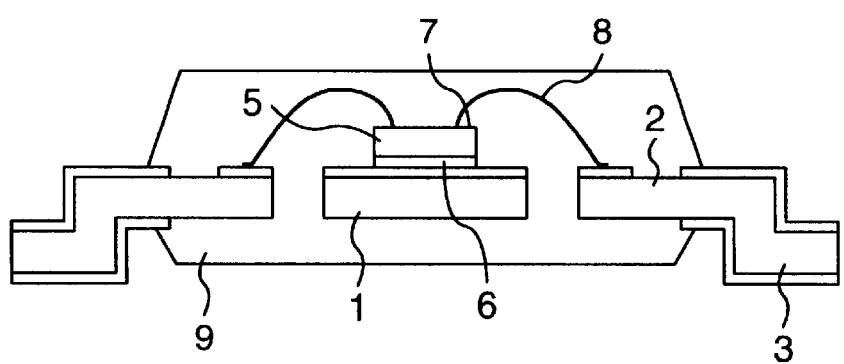
FIG. 4 is a sectional view of the conventional lead frame for electronic parts.

FIG. 1 and FIG. 2 are plan view and sectional view of the lead frame for electronic parts of the present invention. In the present invention, the substrate is not particularly limited, and preferred are copper or copper alloys, nickel or nickel alloys and iron or iron alloys. The inner lead portion 2 which is wire bonded is preferably provided with a silver or silver alloy plating layer 10, and a tin-silver alloy plating layer 11 is formed on the outer lead portion 3. The method for producing the silver or silver alloy plating layer is not particularly limited, and conventional plating baths and methods can be used. The tin-silver alloy plating layer is produced using the pulse plating method of the present invention. The silver or silver alloy plating layer 10 and the tin-silver alloy plating layer 11 may be separated from each other or contact with each other. The silver or silver alloy plating layer 10 may be formed only on the inner lead portion and may cover a part or the whole of the chip-mounting portion 1.

The present invention will be explained in detail by the following examples.

EXAMPLE 1

As the substrates used for lead frames for semiconductor devices, there are used phosphor bronze of low tin content or copper or copper alloys of precipitation hardening type, nickel, iron-nickel alloys containing about 42 wt % of nickel, etc. In this example, alloy 194 was used as the substrate. First, a thin plate of alloy 194 was worked into a shape of lead frame. The working method includes a method which comprises making a mold for punching the shape of lead frame and punching the thin sheet by pressing machine using the mold, and a method which comprises coating a photo-resist on the surface, printing a pattern, then carrying out development to leave the photo-resist as a positive pattern of the lead frame, and processing with an etching solution such as ferric chloride or cupric chloride. In the present invention, the pressing method and the etching method can be optionally selected.

In this example, the plate of alloy 194 was worked into the shape of lead frame by the pressing method, and then subjected to a cleaning step and optionally to a heat-treating step to remove stress produced and remaining in the substrate when the sheet was punched by press, followed by plating step.

A preferred plating step of the present invention will be explained in detail. The plating step can be optionally changed, and the present invention is not limited by the description except for the essential steps.

Oily matters attaching to the lead frame substrate at the steps of pressing and heat-treating were removed with an alkali degreasing agent or the like by a dipping method or an electric method or combination of these methods, and then a copper primary plating of 0.2 $\mu$m or more was formed. A copper cyanide solution was used as a copper primary plating solution. Thereafter, the inner lead portion 2 was subjected to silver plating at a partial silver plating step.

After carrying out the partial silver plating, the outer lead portion 3 is treated with at least one treating agent selected from hydrochloric acid, nitric acid and sulfuric acid in order to improve adhesion between the outer lead portion 3 and the tin-silver alloy plating layer which is formed later on the surface of the outer lead portion 3.

In this example, the impurities on the surface were removed by treating with the treating agent containing hydrochloric acid and, furthermore, adhesion of the tin-silver alloy plating layer was improved by anchoring effect given by the etching of the surface.

After the above pretreatment, the outer lead portion 3 was subjected to partial plating with tin-silver alloy at a current density of 60 A/dm$^2$.

As to the plating solution, the acid can be optionally selected from alkanesulfonic acids, alkanolsulfonic acids, etc., the tin salt can be optionally selected from tin methanesulfonate, SnO, etc., and the silver salt can be optionally selected from silver methanesulfonate, $Ag_2O$, AgO, etc. The composition of the plating solution can be optionally selected from the ranges of 50–200 g/L of acid, 30–70 g/L of tin metal and 0.5–3.0 g/L of silver metal. As the additives, there may be added one or two or more of sulfur compounds, thioamide compounds, thiol compounds, thiosulfates, etc. as stabilizers for silver, one or two or more of carboxylic acids, sulfamic acids, pyrophosphates, chelating agents, etc. as stabilizers for tin, and one or two or more of aromatic sulfonates, aliphatic sulfonates, cationic surface active agents, amphoteric surface active agents, etc. as crystal regulators. The amount of the additives can be optionally set.

In this example, was used a plating solution prepared by adding 5 g/L of 2-aminothiophenol, 20 g/L of naphthalenesulfonic acid polyethylene glycol ether and 50 g/L of bisphenol A dipolyethylene glycol ether to tin methanesulfonate, silver methanesulfonate and methanesulfonic acid as basic components. The plating was carried out by a jet partial plating using a mask.

Figure 5:
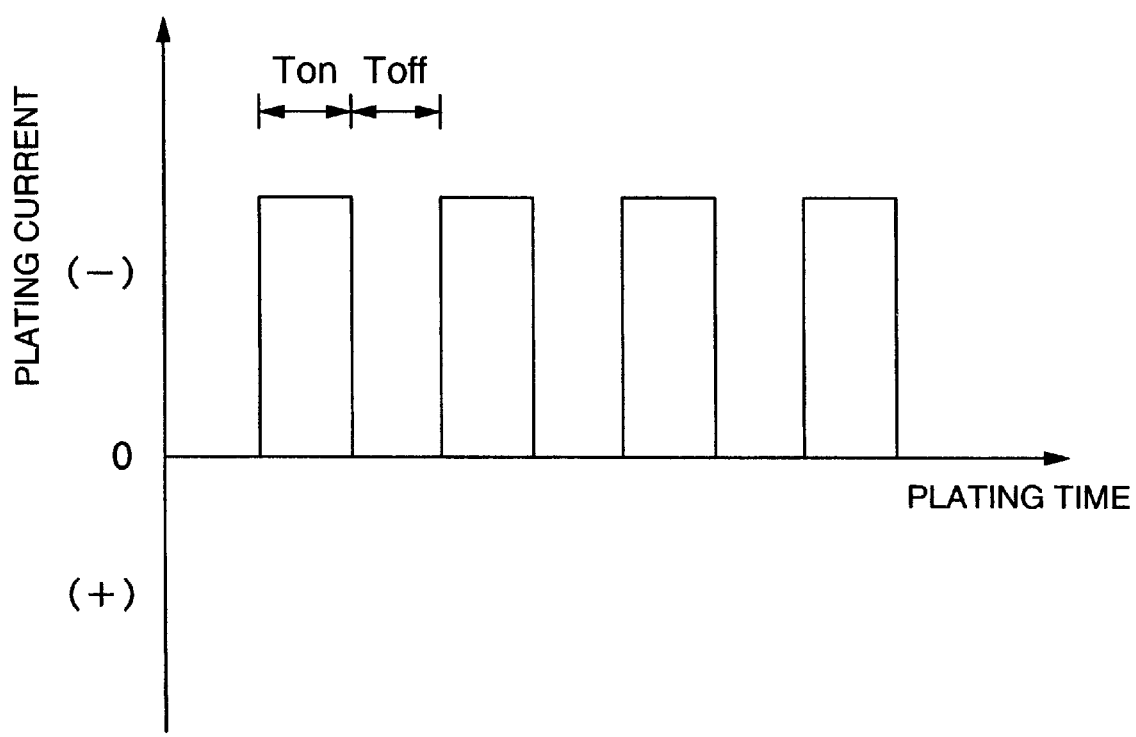
FIG. 5 shows a waveform of current supplied for plating according to the present invention.

FIG. 5 shows a waveform of current applied for plating according to the present invention. The pulse waveform can be optionally selected from the ranges of a current passing period (Ton) of not less than 3 ms and not more than 500 ms and a current stopping period (Toff) of not less than 1 ms and not more than 500 ms, with Toff being equal to or shorter than Ton, preferably Toff being shorter than Ton. If the current passing period and the current stopping period are less than 3 ms and 1 ms, respectively, gloss and solder wettability are deteriorated. If the current passing period is prolonged, namely, the current density is increased for improving the gloss, plating scorch is apt to occur and a normal film can hardly be obtained. If the current passing period is more than 500 ms and the current is close to a direct current, the current density increases and the critical current density decreases, and plating scorch of the film is apt to occur. In order to obtain a good film with no plating scorch, it is preferred to carry out the plating at a low current density and a low electrodeposition speed. Considering the balance between the electrodeposition speed and the film characteristics such as gloss, hardness and plating scorch, the current stopping period and the current passing period are in the ranges as mentioned above, and, more preferably, the current passing period is not less than 3 ms and not more than 50 ms and the current stopping period is not less than 1 ms and not more than 50 ms. If the current stopping period is longer than the current passing period, the plating speed lowers and gloss of the film is deteriorated, which is not preferred. The current density is not particularly limited, and is preferably 20–100 $A/dm^2$, more preferably 30–80 $A/dm^2$ for attaining satisfactory mass productivity.

In this example, the plating was carried out with a current passing period of 3 ms and a current stopping period of 1 ms at a current density of 60 $A/dm^2$ for 20 seconds. Positive electrodes can be optionally selected from insoluble electrodes containing at least one of platinum, iridium, tantalum, rhodium, ruthenium and oxides thereof. In this example, an insoluble electrode comprising a titanium substrate coated with a mixture of iridium oxide and tantalum oxide was used. If soluble electrodes comprising solder alloys are used, the electrodes must be frequently exchanged and the production lines must be stopped each time to cause conspicuous deterioration of mass productivity, which is not preferred.

Thickness of the plating can be optionally selected from the range of preferably 3–15 μm. If the thickness of plating is less than 3 μm, reduction of solder wettability may occur owing to the influence of the primary coat. If the thickness is more than 15 μm, troubles such as leakage of molding resin from the gap of mold may occur at the step of sealing with the molding resin. In this example, tin-silver alloy plating of 8 μm was carried out.

The content of silver in the tin-silver alloy plating film can be optionally selected from the range of preferably 1–8 wt %. If the content of silver is less than 1 wt %, whiskers of tin are apt to be formed, and if it is more than 8 wt %, dissolution stability of Ag in the tin-silver alloy plating solution lowers and Ag is apt to be precipitated. In this example, the content of silver was 3 wt %.

After carrying out the tin-silver alloy plating, the surface was washed with water to remove sufficiently the plating solution. Then, the whole of the lead frame was heated at 150° C. for 40 seconds in a hot-air oven. Subsequently, the surface of the tin-silver alloy plating film was subjected to an etching treatment by dipping in sodium triphosphate dodecahydrate of 120 g/L in concentration at 60° C. for 30 seconds. Then, the surface of the lead frame was subjected to electrical treatment to remove silver which leaked onto the side faces of the lead, followed by subjecting to a discoloration inhibition treatment with an organic film, washing with water and then drying.

The solder wettability was evaluated in the following manner. The resulting tin-silver alloy plating film was heated at 85° C. and 85 RH % for 16 hours, and then only the outer lead portion of the lead frame was cut off and set in a solder wettability testing apparatus (solder checker SWET 100 manufactured by TARUTIN Co., Ltd.). Zero-cross time was measured by soldering test by equilibrium method specified in JIS C 0053. The zero-cross time is the interval time from when the action force first crosses the zero value by contacting the sample which the surface of the solder to when the action force crosses again the zero value due to the wetting of the sample after its receiving the buoyancy which acts on the sample. As a flux, R100–40 (non-halogen) was used, and the molten solder bath was kept at 230° C. and a tin-lead eutectic solder was used. In this example, the zero-cross time was 0.45 second in the initial unheated state, and 0.55 second at 85° C. and 85 RH %. Thus, good solderability of not more than 0.70 second was obtained and discoloration caused by heating did not occur. In the table, "○" means there is no change in color, "Δ" means there is slight change in color, and "x" means there is remarkable change in color.

The flex cracking was evaluated by bending the outer lead portion at 90° using a jig of R 0.25 mm and observing the state of the film with a stereoscopic microscope of 20 magnifications. In the table, "○" means there is no crack, "Δ" means there are cracks which do not reach the base material, and "x" means there are cracks which reach the base material.

The reflection density was obtained by carrying out measurement on micro-area of φ0.05 mm by a micro color difference meter (VSR 300A manufactured by Nippon Denshoku Kogyo Co., Ltd.).

Measurement on the crystal phase was conducted using an X-ray diffractometer (XRD: JDX-8030 manufactured by JEOL Co., Ltd.) under the conditions of scanning range: 30°–80°, measuring time: 1 sec/step, and width of step: 0.1°. The orientation index was calculated by the Willson et al method (K. S. Willson and J. A. Rogers, AES. Tech.

Proceeding, 92 (1964)). That is, when diffraction intensity of each plane index obtained by X-ray diffraction is Ii (hi, ki,li), a ratio of the desired intensity of diffraction plane Ij (hj, kj,lj) and the sum of diffraction intensities of the respective plane index $\Sigma$Ii(hi,ki,li) is I.F=Ij (hj,kj,lj)/$\Sigma$Ii(hi,ki,li). Next, the ratio I.F.R of the sum of the intensities of the respective planes obtained from ASTM card and the desired intensity of diffraction plane is similarly obtained. As a result, the orientation index of crystal is I.F/I.F.R. When the thus obtained orientation index of crystal is 1 or more, the orientation at the lattice plane is high, and it can be judged that crystal of the film is oriented with priority to the orientation index of the crystal. The above results are shown in Table 1.

EXAMPLE 2

The procedure of Example 1 was repeated, except that the plating was carried out under the conditions of a current passing period of 5 ms, a current stopping period of 1 ms and a current density of 50 A/dm$^2$, and the evaluation was similarly conducted.

EXAMPLE 3

The procedure of Example 1 was repeated, except that the plating was carried out under the conditions of a current passing period of 5 ms, a current stopping period of 2 ms and a current density of 43 A/dm$^2$, and the evaluation was similarly conducted.

EXAMPLE 4

The procedure of Example 1 was repeated, except that the plating was carried out under the conditions of a current passing period of 5 ms, a current stopping period of 5 ms and a current density of 40 A/dm$^2$, and the evaluation was similarly conducted.

EXAMPLE 5

The procedure of Example 1 was repeated, except that the plating was carried out under the conditions of a current passing period of 10 ms, a current stopping period of 1 ms and a current density of 54 A/dm$^2$, and the evaluation was similarly conducted.

EXAMPLE 6

The procedure of Example 1 was repeated, except that the plating was carried out under the conditions of a current passing period of 10 ms, a current stopping period of 2 ms and a current density of 50 A/dm$^2$, and the evaluation was similarly conducted.

EXAMPLE 7

The procedure of Example 1 was repeated, except that the plating was carried out under the conditions of a current passing period of 10 ms, a current stopping period of 3 ms and a current density of 46 A/dm$^2$, and the evaluation was similarly conducted.

EXAMPLE 8

The procedure of Example 1 was repeated, except that the plating was carried out under the conditions of a current passing period of 10 ms, a current stopping period of 5 ms and a current density of 53 A/dm$^2$, and the evaluation was similarly conducted.

EXAMPLE 9

The procedure of Example 1 was repeated, except that the plating was carried out under the conditions of a current passing period of 10 ms, a current stopping period of 10 ms and a current density of 40 A/dm$^2$, and the evaluation was similarly conducted.

EXAMPLE 10

The procedure of Example 1 was repeated, except that the plating was carried out under the conditions of a current passing period of 20 ms, a current stopping period of 10 ms and a current density of 40 A/dm$^2$, and the evaluation was similarly conducted.

EXAMPLE 11

The procedure of Example 1 was repeated, except that the plating was carried out under the conditions of a current passing period of 20 ms, a current stopping period of 20 ms and a current density of 50 A/dm$^2$, and the evaluation was similarly conducted.

EXAMPLE 12

The procedure of Example 1 was repeated, except that the plating was carried out under the conditions of a current passing period of 30 ms, a current stopping period of 10 ms and a current density of 51 A/dm$^2$, and the evaluation was similarly conducted.

EXAMPLE 13

The procedure of Example 1 was repeated, except that the plating was carried out under the conditions of a current passing period of 30 ms, a current stopping period of 20 ms and a current density of 45 A/dm$^2$, and the evaluation was similarly conducted.

EXAMPLE 14

The procedure of Example 1 was repeated, except that the plating was carried out under the conditions of a current passing period of 30 ms, a current stopping period of 30 ms and a current density of 50 A/dm$^2$, and the evaluation was similarly conducted.

EXAMPLE 15

The procedure of Example 1 was repeated, except that the plating was carried out under the conditions of a current passing period of 40 ms, a current stopping period of 10 ms and a current density of 50 A/dm$^2$, and the evaluation was similarly conducted.

EXAMPLE 16

The procedure of Example 1 was repeated, except that the plating was carried out under the conditions of a current passing period of 40 ms, a current stopping period of 20 ms and a current density of 38 A/dm$^2$, and the evaluation was similarly conducted.

EXAMPLE 17

The procedure of Example 1 was repeated, except that the plating was carried out under the conditions of a current passing period of 40 ms, a current stopping period of 40 ms and a current density of 50 A/dm$^2$, and the evaluation was similarly conducted.

EXAMPLE 18

The procedure of Example 1 was repeated, except that the plating was carried out under the conditions of a current passing period of 50 ms, a current stopping period of 50 ms and a current density of 38 A/dm², and the evaluation was similarly conducted.

EXAMPLE 19

The procedure of Example 1 was repeated, except that the plating was carried out under the conditions of a current passing period of 1 ms, a current stopping period of 1 ms and a current density of 40 A/dm², and the evaluation was similarly conducted.

EXAMPLE 20

The procedure of Example 1 was repeated, except that the plating was carried out under the conditions of a current passing period of 2 ms, a current stopping period of 1 ms and a current density of 40 A/dm², and the evaluation was similarly conducted.

EXAMPLE 21

The procedure of Example 1 was repeated, except that the plating was carried out under the conditions of a current passing period of 60 ms, a current stopping period of 60 ms and a current density of 40 A/dm², and the evaluation was similarly conducted.

EXAMPLE 22

The procedure of Example 1 was repeated, except that the plating was carried out under the conditions of a current passing period of 100 ms, a current stopping period of 100 ms and a current density of 20 A/dm², and the evaluation was similarly conducted.

EXAMPLE 23

The procedure of Example 1 was repeated, except that the plating was carried out under the conditions of a current passing period of 500 ms, a current stopping period of 100 ms and a current density of 42 A/dm², and the evaluation was similarly conducted.

EXAMPLE 24

The procedure of Example 1 was repeated, except that the plating was carried out under the conditions of a current passing period of 800 ms, a current stopping period of 500 ms and a current density of 40 A/dm², and the evaluation was similarly conducted.

Comparative examples will be given below.

Comparative Example 1

The procedure of Example 1 was repeated, except that the plating was carried out using a current having a waveform of 5% ripple (direct current) which was obtained by full-wave rectification of three-phase alternating current and at a current density of 40 A/dm², and the evaluation was similarly conducted.

Comparative Example 2

The procedure of Example 1 was repeated, except that the plating was carried out using a current having a waveform of 48% ripple which was obtained by full-wave rectification of single-phase alternating current and at a current density of 40 A/dm², and the evaluation was similarly conducted.

The above results are shown in Table 1.

TABLE 1

| | Waveform of current | Current passing period (ms) | Current stopping period (ms) | Current density (A/dm²) | Reflection density | Orientation index of crystal | | | | Initial zero-cross time (s) | Zero-cross time after heating (s) | Flex cracking | Discoloration after heating |
| | | | | | | (200) | (220) | (211) | (101) | | | | |
| --- | --- | --- | --- | --- | --- | --- | --- | --- | --- | --- | --- | --- | --- |
| Example 1 | Pulse | 3 | 1 | 60 | 2.13 | 0.00 | 3.03 | 1.68 | 0.38 | 0.45 | 0.55 | ○ | ○ |
| Example 2 | Pulse | 5 | 1 | 50 | 1.21 | 0.00 | 1.17 | 2.98 | 0.61 | 0.44 | 0.53 | ○ | ○ |
| Example 3 | Pulse | 5 | 2 | 43 | 1.03 | 0.00 | 0.72 | 1.69 | 1.37 | 0.51 | 0.60 | ○ | ○ |
| Example 4 | Pulse | 5 | 5 | 40 | 1.05 | 0.00 | 5.34 | 1.25 | 0.22 | 0.40 | 0.47 | ○ | ○ |
| Example 5 | Pulse | 10 | 1 | 54 | 2.18 | 0.00 | 3.50 | 1.90 | 0.00 | 0.49 | 0.57 | ○ | ○ |
| Example 6 | Pulse | 10 | 2 | 50 | 2.02 | 0.00 | 1.76 | 2.83 | 0.22 | 0.39 | 0.47 | ○ | ○ |
| Example 7 | Pulse | 10 | 3 | 46 | 2.40 | 0.00 | 2.06 | 2.14 | 0.46 | 0.38 | 0.42 | ○ | ○ |
| Example 8 | Pulse | 10 | 5 | 53 | 2.30 | 0.00 | 4.75 | 1.46 | 0.00 | 0.40 | 0.48 | ○ | ○ |
| Example 9 | Pulse | 10 | 10 | 40 | 2.52 | 0.00 | 4.80 | 1.25 | 0.00 | 0.38 | 0.42 | ○ | ○ |
| Example 10 | Pulse | 20 | 10 | 40 | 2.53 | 0.00 | 4.72 | 1.19 | 0.00 | 0.38 | 0.43 | ○ | ○ |
| Example 11 | Pulse | 20 | 20 | 50 | 2.48 | 0.00 | 1.14 | 2.19 | 0.27 | 0.41 | 0.48 | ○ | ○ |
| Example 12 | Pulse | 30 | 10 | 51 | 2.55 | 0.00 | 3.35 | 0.97 | 0.00 | 0.38 | 0.43 | ○ | ○ |
| Example 13 | Pulse | 30 | 20 | 45 | 2.50 | 0.00 | 2.52 | 1.23 | 0.20 | 0.35 | 0.37 | ○ | ○ |
| Example 14 | Pulse | 30 | 30 | 50 | 2.45 | 0.00 | 1.14 | 2.38 | 0.39 | 0.36 | 0.39 | ○ | ○ |
| Example 15 | Pulse | 40 | 10 | 50 | 2.59 | 0.00 | 4.04 | 0.85 | 0.00 | 0.36 | 0.38 | ○ | ○ |
| Example 16 | Pulse | 40 | 20 | 38 | 2.55 | 0.00 | 2.88 | 1.16 | 0.00 | 0.32 | 0.33 | ○ | ○ |
| Example 17 | Pulse | 40 | 40 | 50 | 2.52 | 0.12 | 1.17 | 2.06 | 0.59 | 0.35 | 0.38 | ○ | ○ |
| Example 18 | Pulse | 50 | 50 | 38 | 2.59 | 0.00 | 2.71 | 1.12 | 0.20 | 0.38 | 0.43 | ○ | ○ |
| Example 19 | Pulse | 1 | 1 | 40 | 0.66 | 0.00 | 0.00 | 0.96 | 2.33 | 0.52 | 0.63 | △ | ○ |
| Example 20 | Pulse | 2 | 1 | 40 | 0.90 | 0.00 | 0.00 | 0.44 | 3.65 | 0.52 | 0.62 | △ | ○ |
| Example 21 | Pulse | 60 | 60 | 40 | 2.40 | 0.10 | 2.11 | 0.82 | 0.20 | 0.70 | 0.85 | ○ | △ |
| Example 22 | Pulse | 100 | 100 | 20 | 2.45 | 0.10 | 1.38 | 0.80 | 0.20 | 0.40 | 0.50 | ○ | ○ |
| Example 23 | Pulse | 500 | 100 | 42 | 1.10 | 0.00 | 5.10 | 1.05 | 0.15 | 0.60 | 0.70 | ○ | ○ |
| Example 24 | Pulse | 800 | 500 | 40 | 0.66 | 0.00 | 0.60 | 0.80 | 1.60 | 0.75 | 0.88 | △ | △ |
| Comparative Example 1 | Direct current | — | — | 40 | 2.40 | 0.00 | 0.40 | 0.80 | 3.00 | 1.00 | 1.08 | X | △ |
| Comparative Example 2 | 48% ripple | — | — | 40 | 0.56 | 0.00 | 0.00 | 0.40 | 3.65 | 1.12 | 1.32 | △ | △ |

As shown in the above examples, in the tin-silver alloy plating film formed by an electroplating method using a current having a pulse waveform of a current passing period of not less than 3 ms and not more than 500 ms and a current stopping period of not less than 1 ms and not more than 500 ms with the stopping period being equal to or shorter than the passing period, and in the lead frame for electronic parts having the above plating film, cracks hardly occurred at the time of flexural working, and, furthermore, gloss and solder wettability were improved and discoloration upon heating was inhibited.

Furthermore, in the tin-silver alloy plating film which has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4 and in the lead frame for electronic parts having said plating film, cracks hardly occurred at the time of flexural working, and, furthermore, gloss and solder wettability were improved and discoloration upon heating was inhibited.

In the above examples, mention has been made of the tin-silver alloy plating on the lead frame comprising copper, but the similar results were obtained in the tin-silver alloy plating on the lead frame comprising alloy 42.

In the above examples, mention has been made of the tin-silver alloy plating on the lead frame, but the present invention is not limited to this use.

As described above, according to the present invention, a tin-silver alloy plating film improved in solderability and flex cracking characteristics is provided.

What is claimed is:

1. A method for producing a tin-silver alloy plating film by an electroplating process which uses a current having a pulse waveform of a current passing period of not less than 3 ms and not more than 500 ms and a stopping period of not less than 1 ms and not more than 500 ms with the stopping period being equal to or shorter than the passing period, wherein the current passing period is not less than 3 ms and not more than 50 ms and the current stopping period is not less than 1 ms and not more than 50 ms.

2. A tin-silver alloy plating film which is produced by an electroplating process which uses a current having a pulse waveform of a current passing period of not less than 3 ms and not more than 500 ms and a stopping period of not less than 1 ms and not more than 500 ms with the stopping period being equal to or shorter than the passing period and which has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4.

3. A tin-silver alloy plating film which has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4.

4. A lead frame for electronic parts which has the tin-silver alloy plating film produced by an electroplating process which uses a current having a pulse waveform of a current passing period of not less than 3 ms and not more than 500 ms and a stopping period of not less than 1 ms and not more than 500 ms with the stopping period being equal to or shorter than the passing period.

5. A lead frame for electronic parts according to claim 4, wherein the tin-silver alloy plating film has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4.

6. A lead frame for electronic parts which has a tin-silver alloy plating film, wherein the tin-silver alloy plating film has a reflection density of not less than 1.0 and comprises an alloy containing silver and tin which has an orientation index of crystal at plane (220) of not less than 0.7 and not more than 5.4, an orientation index of crystal at plane (211) of not less than 0.8 and not more than 3.0, an orientation index of crystal at plane (200) of not more than 0.2 and an orientation index of crystal at plane (101) of not more than 1.4.

* * * * *